(12) United States Patent
Sasaki

(10) Patent No.: US 7,161,352 B2
(45) Date of Patent: Jan. 9, 2007

(54) BEAM CURRENT MEASURING DEVICE AND APPARATUS USING THE SAME

(75) Inventor: Yuichiro Sasaki, Machida (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 91 days.

(21) Appl. No.: 11/023,495

(22) Filed: Dec. 29, 2004

(65) Prior Publication Data

US 2005/0110484 A1    May 26, 2005

(30) Foreign Application Priority Data

Jun. 7, 2002    (JP)    ............... 2002-167187

(51) Int. Cl.
*G01R 31/00*    (2006.01)
*G01R 33/02*    (2006.01)

(52) U.S. Cl. ............... 324/248; 250/492.21; 324/71.3; 424/9.3

(58) Field of Classification Search ............... 324/248; 250/492.21

See application file for complete search history.

(56) References Cited

U.S. PATENT DOCUMENTS

| | | | | |
|---|---|---|---|---|
| 4,687,987 A | * | 8/1987 | Kuchnir et al. | ............ 324/71.3 |
| 6,159,444 A | * | 12/2000 | Schlenga et al. | ............ 424/9.3 |
| 6,822,247 B1 | * | 11/2004 | Sasaki | ............ 250/492.21 |
| 2003/0230732 A1 | * | 12/2003 | Sasaki | ............ 250/492.21 |

OTHER PUBLICATIONS

T. Tanabe et al., "A cryogenic current-measuring device with nano-ampere resolution at the storage ring TARN II", Nuclear Instruments and Methods in Physics Research A 427 (1999) pp. 455-464.

L. Hao et al., "HTS Flux Concentrator For Non-Invasive Sensing of Charged Particle Beams", ISEC 2001, pp. 469-470.

* cited by examiner

*Primary Examiner*—Nikita Wells
*Assistant Examiner*—James J. Leybourne
(74) *Attorney, Agent, or Firm*—Wenderoth, Lind & Ponack, L.L.P.

(57) ABSTRACT

A beam current measuring device (BMD) capable of measuring beam current while radiating the beam on a target, such as a semiconductor wafer. The BMD at least includes: (a) a detecting part operable to detect or collect a magnetic field corresponding to the beam current; and (b) a measuring part including (i) a SQUID sensitive to magnetic flux, and (ii) a feedback coil operable to carry feedback current wherein the feedback current is operable to cancel out a change in the magnetic flux penetrating through the SQUID. Wherein the operating point of the SQUID is set according to a finite beam current value, other than zero, which penetrates through the detecting part.

A BMD of the present invention can be incorporated and used in an ion-implantation apparatus, an electron beam exposure apparatus, an accelerator, and the like.

5 Claims, 5 Drawing Sheets

BEAM CURRENT MEASURING DEVICE AND APPARATUS USING THE SAME

FIELD OF THE INVENTION

The present invention relates to a beam current measuring device for accurately measuring a value of ion beam current without interrupting the beam and also relates to an apparatus using the beam current measuring device.

BACKGROUND OF THE INVENTION

Method of accurately measuring a value of ion beam current without interrupting the beam is disclosed in the following reference: "A cryogenic current-measuring device with nano-ampere resolution at the storage ring TARN II, Nuclear Instruments and Methods in Physics Research A 427 (1999) 455–464"(hereinafter referred to as reference 1).

This method determines a beam current value by using a superconducting quantum interference device (hereinafter referred to as a SQUID), i.e. a highly-sensitive magnetic field sensor for measuring the magnetic field generated by the beam current.

The beam current measuring device utilized in this method is primarily comprised of: (a) a detecting part operable to detect a magnetic field corresponding to beam current; (b) a magnetic flux transfer part operable to transfer magnetic flux to a measuring part; (c) the measuring part includes (i) a superconducting element being sensitive to the transferred magnetic flux and (ii) a feedback coil operable to carry feedback current for canceling out a change in the magnetic flux penetrating through the superconducting element; and (d) a magnetic shielding part comprised of a superconductor operable to magnetically shield the detecting part, the magnetic flux transfer part, and the measuring part from an external space including the space carrying ion beams.

The detecting part is comprised of a coil in which superconducting wires are wound around a core made of a soft magnetic material. The core of the soft magnetic material collects the magnetic field generated by beam current which induces superconducting current through the coil. The induced superconducting current is transferred to a coil placed adjacent to a SQUID. A change in the superconducting current flowing through the coil in response to a change in beam current attempts to change the amount of magnetic flux penetrating through the SQUID. However, the beam current measuring device is structured in such a manner that the feedback coil carries the feedback current so as to not to change the amount of magnetic flux penetrating through the SQUID, and to cancel out the change. Further, because the feedback current is proportional to the change in beam current value, measurement of the feedback current can be utilized to determine the amount of the change in the beam current value.

Recently, a method of measuring a beam current value using a high-temperature superconductor has been disclosed in "HTS Flux Concentrator For Non-Invasive Sensing Of Charged Particle Beams, ISEC 2001, page 469–470". ISEC 2001 stands for 8th International Superconductive Electronics Conference, Jun. 19–22, 2001 Osaka, Japan.

This method uses a cylinder coated with a high-temperature superconductor on the surface thereof as a detecting section. However, on the outer peripheral surface of the cylinder, a bridge part partially made of a high-temperature superconductor is provided. Beam current penetrating through the center of the cylinder induces surface shielding current on the surface of the cylinder. The surface shielding current is concentrated on the bridge part. In this measuring method, the magnetic flux generated by the concentrated surface shielding current is measured by a SQUID.

Experiments are conducted to determine the sectional area of scattered molecular ions by placing such a beam current measuring device in a beam storage ring and measuring the attenuation of the beam current value when a circulating ion beam collides with a target gas, deviates from the orbit, and the number of ions decreases.

For example, the following demonstrates how a beam current of several hundred nanoamperes, upon colliding with the beam storage ring, attenuates to several nanoamperes for several dozen seconds.

According to reference 1, a good linearity of the output of the beam current measuring device is kept up to 2.5 µA. This is a measuring range sufficient to measure beams fluctuating from several hundred nanoamperes to several nanoamperes. Specifically, the operating point of the SQUID is locked at zero beam current, and thereafter, the attenuation of the beams colliding with the beam storage ring is measured. In other words, the amount of change from zero (operating point of the SQUID) is measured with respect to zero beam current.

However, the conventional methods are limited by a narrow measuring range. When the measuring range is widened, measuring accuracy decreases. In other words, the conventional methods cannot measure beam current of several microamperes or larger. For example, in an ion-implantation apparatus for use in semiconductor production, a semiconductor wafer is irradiated with an ion beam ranging from a microampere to several dozen milliamperes. To properly control the irradiation dose, beam current values must be measured with an error of 1% or smaller.

Application of the conventional beam current measuring device incorporating a SQUID for the use described above poses a problem. Because the linearity of the output is kept only at several microamperes or smaller, the device cannot be used. Further, when the range, in which the linearity of the output is kept is widened from a microampere to several dozen milliamperes, the sensitivity of the output with respect to the beam current has to be decreased. As a result, there is a problem of a decrease in measuring accuracy.

SUMMARY OF THE INVENTION

The present invention provides a beam current measuring device comprising: (a) a detecting part operable to detect or collect a magnetic field corresponding to a beam current; and (b) a superconducting quantum interference device (SQUID) which responds to a magnetic flux. The operating point of the SQUID is set according to a finite beam current, excluding zero, penetrating the detection part.

Further the present invention includes an ion-implantation apparatus, an electron beam exposure apparatus, and an accelerator comprising the beam current measuring device.

DETAILED DESCRIPTION OF THE PREFERRED EMBODIMENT

In a beam current measuring device of the present invention, beam current is determined in the following manner.

First, the operating point of a SQUID is locked when the beam current takes a finite value other than zero. In other words, with respect to the finite beam current value, the amount of change from the locked operating point of the SQUID is measured. For example, in an ion-implantation apparatus, after a beam for ion implantation is set to a substantially fixed value, the operating point of the SQUID is set according to the fixed value. Then, fluctuations of the beam current thereafter are measured with the beam current measuring device. The value of the current, when the operating point of the SQUID is set, is measured with a Faraday cup located on the beampath. Thereafter, the Faraday cup may be moved to a position in which the beam is not interrupted. Alternatively, after the operating point of the SQUID is set, the beam can be radiated with a target, (e.g. a semiconductor wafer) inserted.

The beam current value is determined by adding the measurement obtained by the Faraday cup when the operating point of the SQUID is set with the measurement obtained by the beam current measuring device.

In this manner, the present invention allows measurement of beam current values which could not be measured with conventional devices because the values are out of the range wherein the output remains linear. Accordingly, substantially fixed but slightly fluctuating beams, such as those used for ion implantation in semiconductor production, can accurately be measured. As a result, while a target (e.g. a semiconductor wafer) is irradiated with a beam, the beam current can be measured at the same time.

An example of an embodiment of the present invention is described with reference to the accompanying drawings.

Drawings are schematic and thus do not show accurate dimensional positions.

In this exemplary embodiment, instead of ion beams, a one turn coil carrying simulated current is used for the experiments. A Lecroy waveform generator LW420 is used as the power source of the simulated current. Further, a Tektronix TDS520D is used as an oscilloscope.

Exemplary Embodiment

Figure 1:
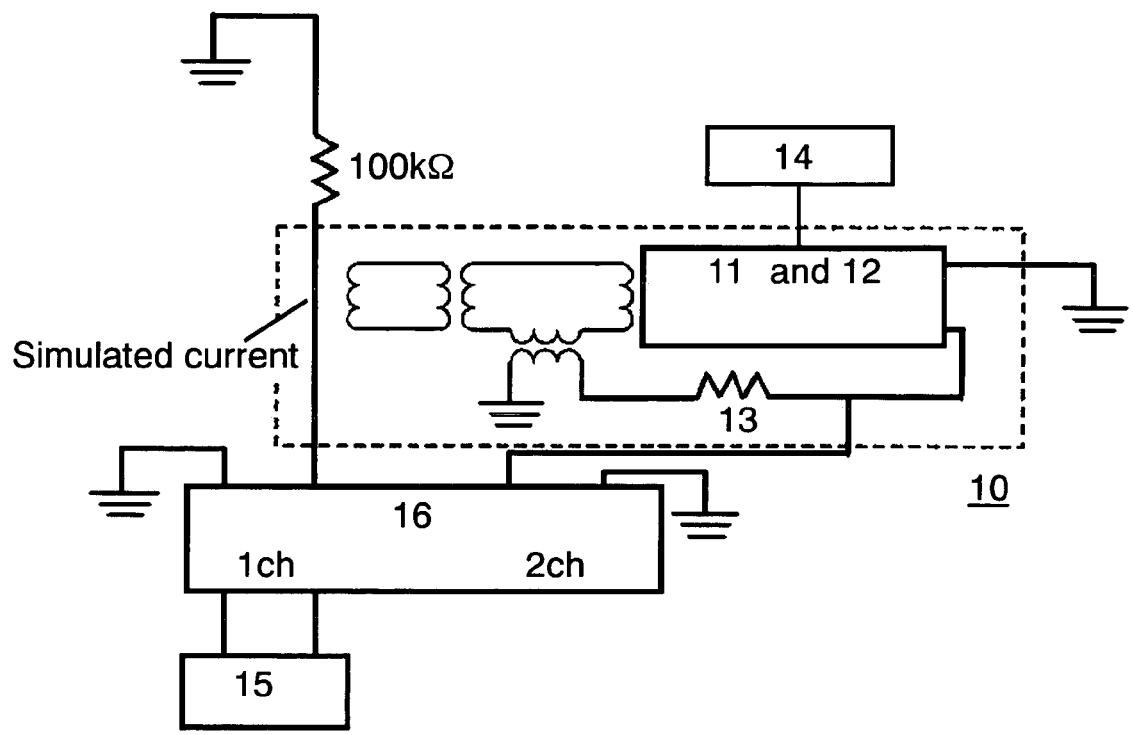
FIG. 1 is a block diagram of a circuit used for examining a performance of a beam current measuring device of the present invention.

FIG. 1 is a block diagram of a circuit used for examining the performance of a beam current measuring device of the present invention. Simulated current flows through an electric wire set in the vicinity of a path corresponding to the axis of a beam path of the beam current measuring device. The output of the beam current measuring device 10 is measured on 2-channel of the oscilloscope 16. The output is equivalent to the potential difference across the feedback resistor 13 of FIG. 1. This potential difference is proportional to a change in ion beam current. The feedback resistance of the feedback resistor 13 is set to 4.7 kΩ. As necessary, an image of the oscilloscope 16 is obtained using a digital camera.

Voltages are converted into current through a resistor of 100 kΩ to provide the simulated current. For example, when a voltage of 10 mV is supplied from a power source 15, a simulated current of 100 nA flows. The voltages generated from the power source 15 are monitored on 1-channel of the oscilloscope 16. By changing the settings of the power source 15, simulated current of triangular waves, or waves simulating the fluctuations of the beam current of an ion-implantation apparatus is provided. Next, examples of the measurement are given.

Figure 2:
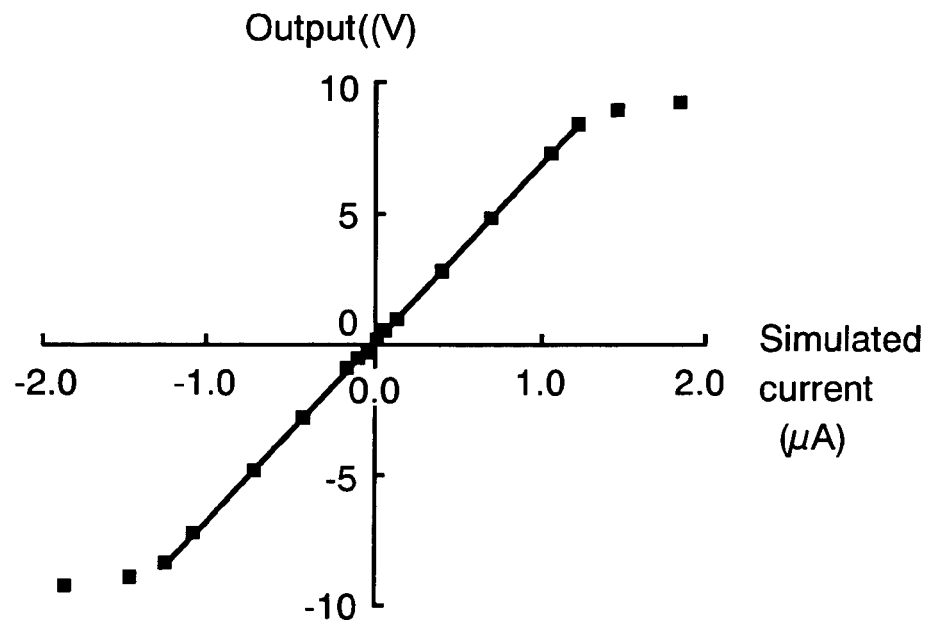
FIG. 2 is a graph showing output of simulated current of triangular waves at a frequency of 1 Hz.

FIG. 2 demonstrates a plot of the output with respect to simulated current of triangular waves at a frequency of 1 Hz. In this graph, excellent linearity is obtained within the range of approximately ±1.3 μA. The current sensitivity is 6.8 mV/nA.

Further, even when the position of the electric wire set along the path corresponding the axis of the beam path is changed, similar effects are obtained. Thus, it has been proved that the output does not depend on the position of the current.

Figure 3:
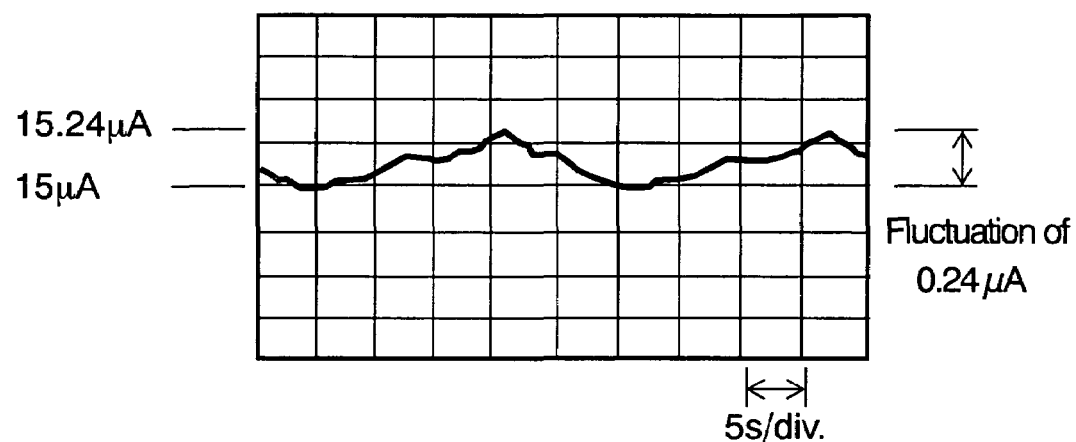
FIG. 3 shows a waveform of a power source for current simulating fluctuations of beam current of an ion-implantation apparatus.

FIG. 3 shows the waveform of a power source for current simulating fluctuations of the beam current of an ion-implantation apparatus. Current that is zero at the beginning rises to 15 μA at a certain point. The rise time is for one microsecond. Thereafter, the current fluctuates within the range of 15 μA and 15.24 μA, for approximately 25 seconds. The fluctuations are repeated in a cycle of 25 seconds. The fluctuation width is 0.24 μA, i.e. fluctuations of 1.6% with respect to 15 μA. The output of such simulated current is measured.

After the current rises to 15 μA, the operating point of SQUID 11 is set.

Figure 4:
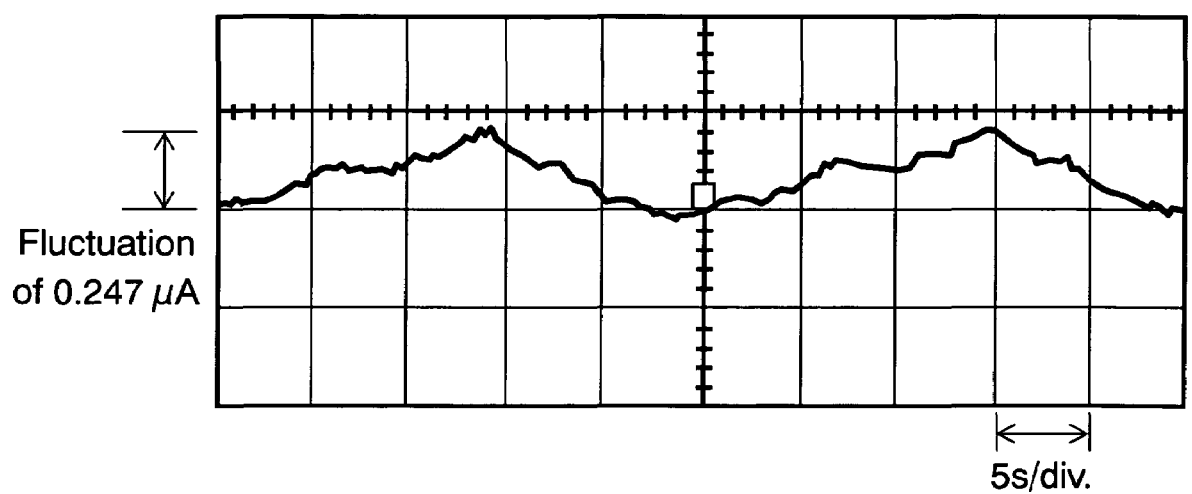
FIG. 4 is a graph showing output of simulated current ranging from 15 to 15.24 μA.

Then, the fluctuations of the current are measured. FIG. 4 shows the results of measured output. This graph reproduces the current fluctuations. In comparison with a fluctuation width of the simulated current of 0.24 μA, the fluctuation width of the output is 0.247 μA. In other words, the error is 7 nA. This means that a simulated current of 15 μA can be measured with an error of 0.05%. Additionally, the time delay of the output fluctuations is not seen.

Figure 5:
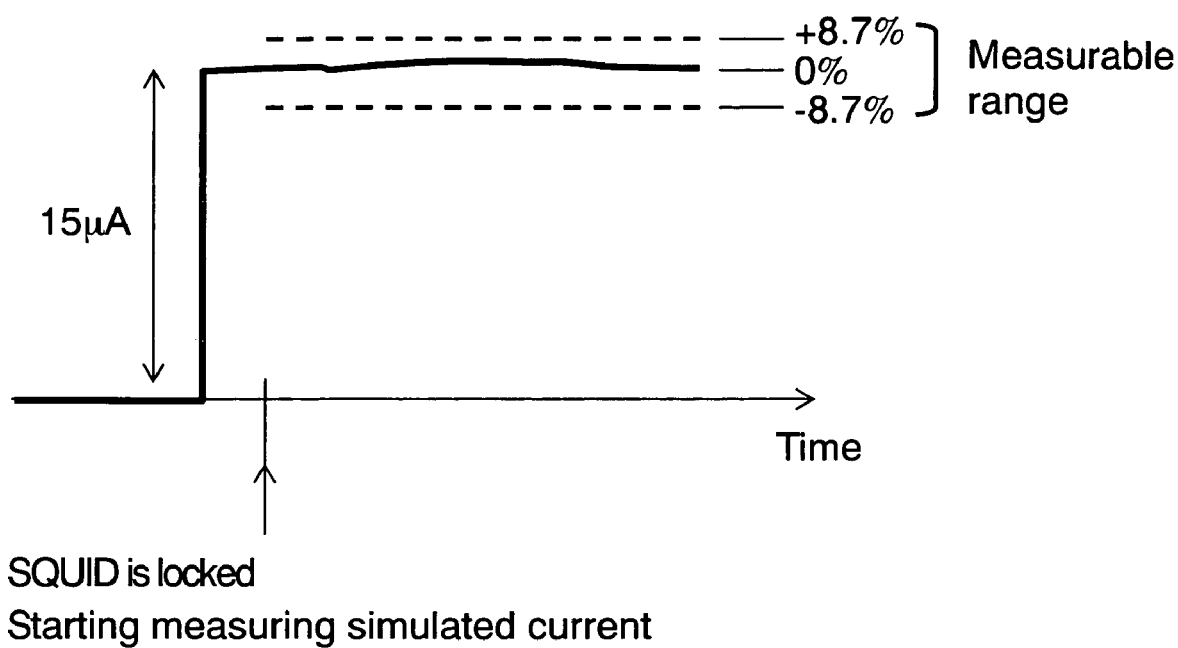
FIG. 5 is a drawing for explaining operation of measuring the simulated current ranging from 15 to 15.24 μA.

FIG. 5 describes how a simulated current ranging from 15 to 15.24 μA can be measured even though the linearity of output is kept only within the range of ±1.3 μA.

At the beginning, the simulated current is zero. At this time, SQUID 11 is not operated. Then, after a current of 15 μA has begun to flow, the operating point of SQUID 11 is set. Thus, the range of ±1.3 μA can be measured mainly around the value taken when the operating point of SQUID 11 is set. In other words, the range of 15±1.3 μA can be measured. This corresponds to the range of 15 μA±8.7%.

This method is based on the characteristics that SQUID 11 in the measuring part of this device can measure a change in magnetic flux occurring after the operating point of SQUID 11 is set.

In this embodiment, a simulated current of 15 μA is measured. However, if the device is designed to decrease or increase its sensitivity according to the fluctuation width of a beam to be used, the device can accommodate a wide range of current values.

Figure 7:
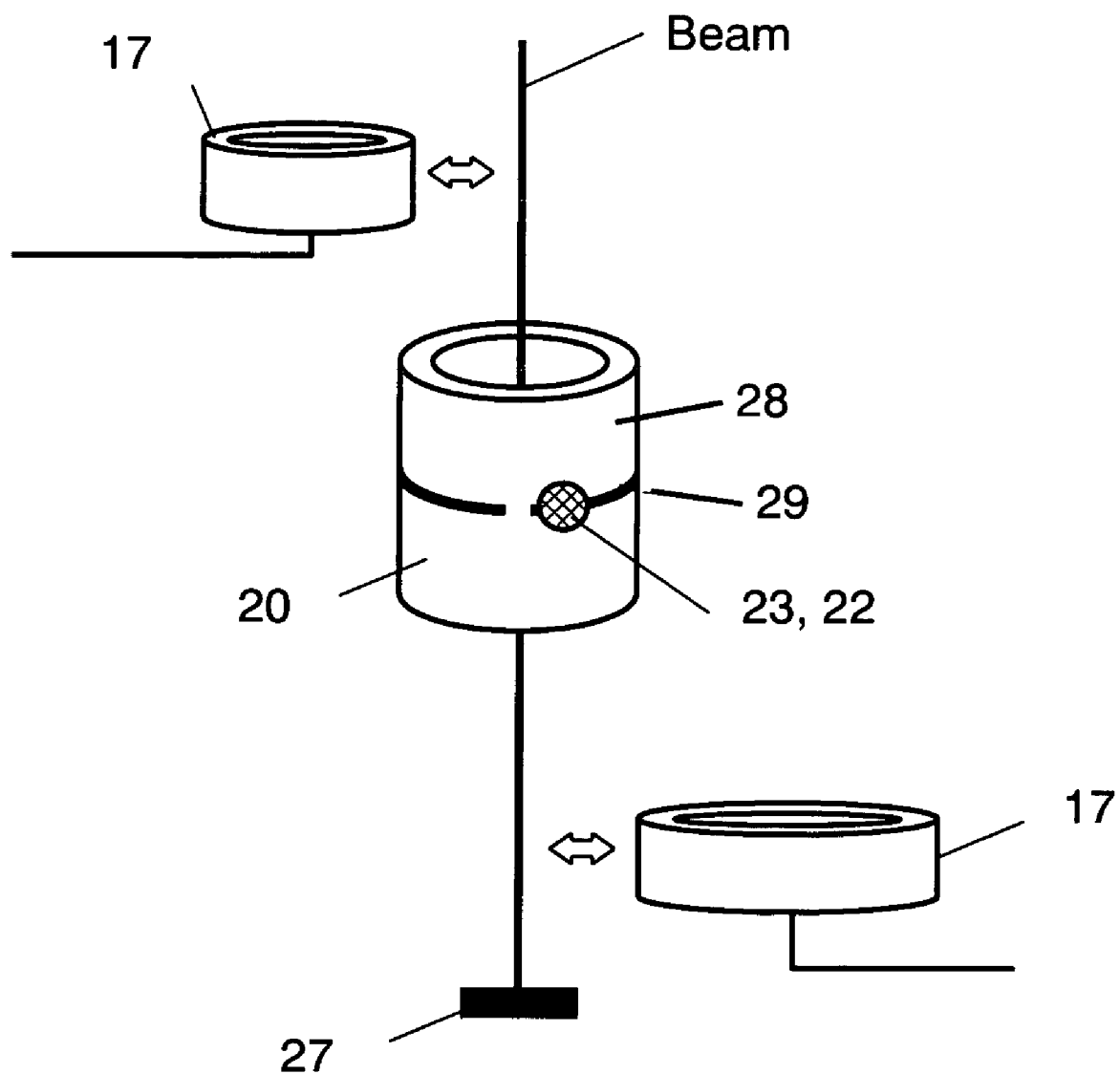
FIG. 7 is a drawing for showing a beam current measuring device having a detecting part comprised of a cylinder coated with a high-temperature superconductor on the surface thereof, and a beam location, according to the present invention.

Also when the detecting part is a cylinder coated with a high-temperature superconductor on the surface thereof, as shown in FIG. 7, the present invention can be implemented and provide similar effects. The detecting part 20 of FIG. 7 is a cylinder coated with a high-temperature superconductor on the surface thereof. Area 28 is made of a high-temperature superconductor. Area 29 is made of a metal or an insulator. As shown in the drawing, on the outer peripheral surface, a bridge part partially made of a high-temperature superconductor is provided. Beam current penetrating through the center of the cylinder induces surface shielding current on the surface of the cylinder. The surface shielding current is concentrated on the bridge part. The magnetic flux generated by the concentrated surface shielding current is measured by SQUID 11.

Figure 6:
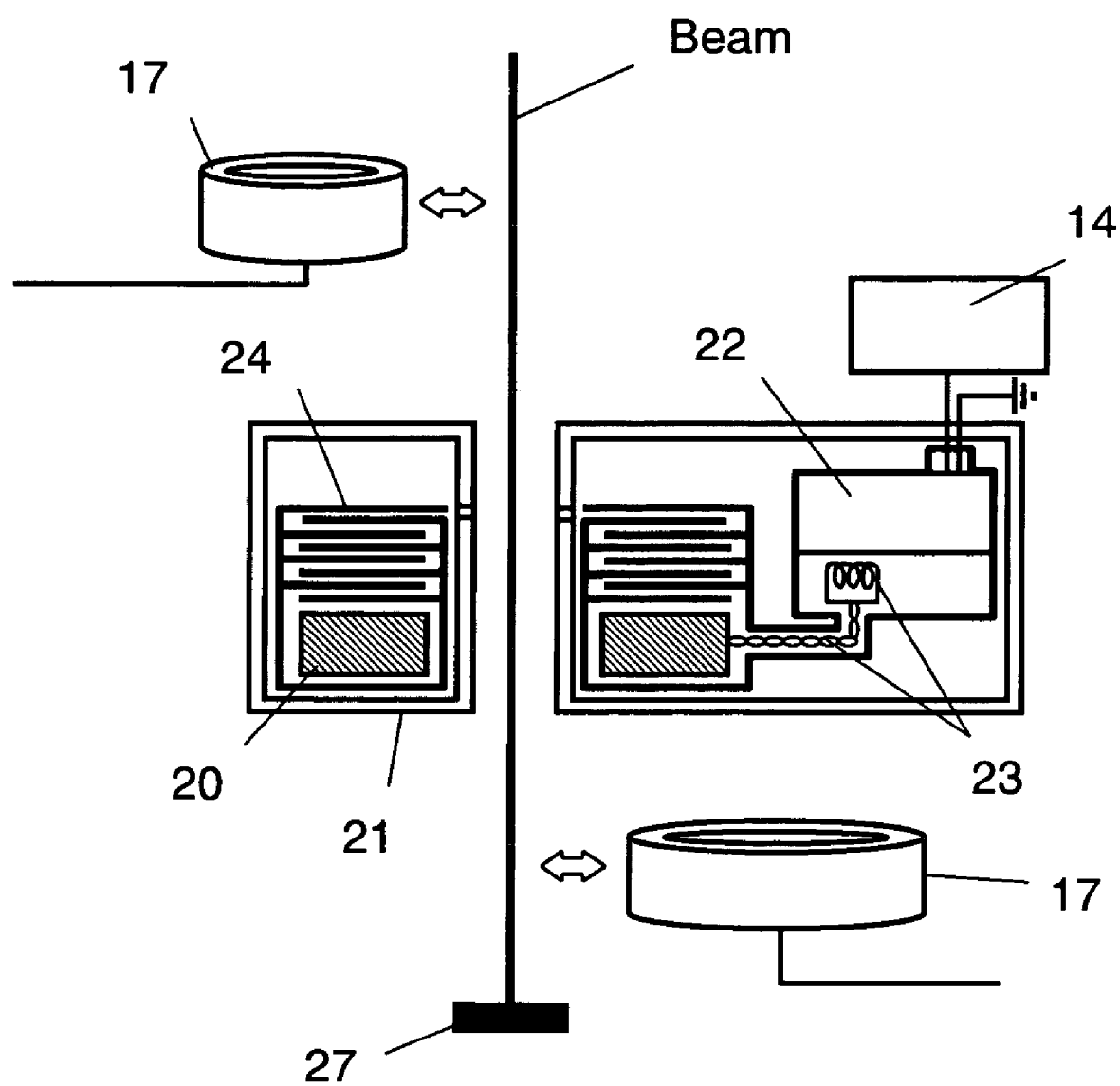
FIG. 6 is a drawing for showing a beam current measuring device having a detecting part comprised of a high permeability core, a superconducting coil, and a beam location, according to the present invention.

A description is provided hereinafter with reference to FIGS. 6 and 7. A Faraday cup 17 is located between the detecting part 20 and the target 27. Initially, the Faraday cup 17 is located on the path of the beam, such that the Farady cup 17 is interrupting the beam. After the beam is drawn from an ion source, the value of the beam current is measured with the Faraday cup 17. Next, the operating point of SQUID 11 is set. The value of the beam current, taken when the operating point of SQUID 11 is set, is measured with the Faraday cup 17. The amount of a change in the beam current, after the operating point of SQUID 11 is set, is measured by SQUID 11. Thereafter, the Faraday cup 17 is moved out of the path of the beam, and a target 27 of various kinds of products, such as a semiconductor wafer, is irradiated with the beam. Alternatively, a Faraday cup 17 can be located in a position such that the detecting part 20 is between the target 27 and the Faraday cup 17. In this case, initially, Faraday cup 17 is placed on the path of the beam such that the Faraday cup 17 is interrupting the beam. After the beam is drawn from an ion source, the value of the beam current is measured with the Faraday cup 17. Next, the Faraday cup 17 is moved out of the path of the beam, and target 27 of various kinds of products, such as a semiconductor wafer, is irradiated with the beam. Immediately after the irradiation, the operating point of SQUID 11 is set.

Measuring part 22 includes SQUID 11, feedback coil 25 for carrying feedback current to cancel out a change in magnetic flux penetrating through SQUID 11.

Control circuit 14 controls measuring part 22 and locks the operating point of SQUID 11.

Magnetic shielding part 24 includes a superconductor for magnetically shielding the detecting part 20, the magnetic flux transfer part 23, and the measuring part 22 from an external space including a space carrying an ion beam.

Cryostat 21 is an apparatus used to provide low-temperature environments in which operations may be carried out under controlled conditions.

As described above, a beam current measuring device 10 of the present invention has a wide range of applications when it is desired to accurately measure a substantially fixed but slightly fluctuating beam. For example, a beam current measuring device of the present invention can be incorporated and used in an ion-implantation apparatus, electron beam exposure apparatus, accelerator, and the like.

What is claimed is:

1. A beam current measuring device comprising:
a detecting part operable to detect a magnetic field of a beam current;
a superconducting quantum interference device (SQUID) operable to measure the magnetic field according to a beam current value, wherein an operating point of said SQUID is set when the beam current, which penetrates through said detecting part, is a value other than zero; and
a Faraday cup operable to measure the beam current value.

2. The beam current measuring device of claim 1, wherein
the operating point of said SQUID is set according to the beam current value measured by said Faraday cup;
an amount of change in the beam current value is measured by said SQUID after the operating point of said SQUID is set; and
the beam current value measured by said Faraday cup is added to the amount of change in the beam current value measured by said SQUID.

3. An ion-implantation apparatus including a beam current measuring device comprising:
a detecting part operable to detect a magnetic field of a beam current;
a magnetic flux transfer part operable to transfer a magnetic flux, corresponding to the magnetic field detected by said detecting part, to a measuring part;
said measuring part being operable to measure a change in the beam current value according to a change in the magnetic flux, said measuring part including:
a superconducting quantum interference device (SQUID) operable to receive the magnetic flux transferred from said magnetic flux transfer part, and operable to measure the magnetic flux received from said magnetic flux transfer part according to the amount of magnetic flux passing through said SQUID; and
a feedback coil operable to carry a feedback current, wherein
the value of the feedback current carried by said feedback coil is operable to cancel a change in the magnetic flux passing through said SQUID; and
the value of the feedback current is operable to represent an amount of change in the beam current value;
a magnetic shielding part including a superconductor operable to magnetically shield each of said detecting part, said magnetic flux transfer part, and said measuring part, from an external space including a space carrying the beam; and
a Faraday cup operable to measure the beam current value, wherein an operating point of said SQUID is set according to the measured beam current value measured by said Faraday cup;
wherein, the amount of change in the beam current value is measured by said measuring part after the operating point of said SQUID is set, and the beam current value measured by said Faraday cup is added to the amount of change in the beam current value measured by said measuring part.

4. An electron beam exposure apparatus including a beam current measuring device comprising:
a detecting part operable to detect a magnetic field of a beam current;
a magnetic flux transfer part operable to transfer a magnetic flux, corresponding to the magnetic field detected by said detecting part, to a measuring part;
said measuring part being operable to measure a change in the beam current value according to a change in the magnetic flux, said measuring part including:
a superconducting quantum interference device (SQUID) operable to receive the magnetic flux transferred from said magnetic flux transfer part, and operable to measure the magnetic flux received from said magnetic flux transfer part according to the amount of magnetic flux passing through said SQUID; and a feedback coil operable to carry a feedback current, wherein
- the value of the feedback current carried by said feedback coil is operable to cancel a change in the magnetic flux passing through said SQUID; and
- the value of the feedback current is operable to represent an amount of change in the beam current value;

a magnetic shielding part including a superconductor operable to magnetically shield each of said detecting part, said magnetic flux transfer part, and said measuring part, from an external space including a space carrying the beam; and a Faraday cup operable to measure the beam current value, wherein an operating point of said SQUID is set according to the measured beam current value measured by said Faraday cup;

wherein, the amount of change in the beam current value is measured by said measuring part after the operating point of said SQUID is set, and the beam current value measured by said Faraday cup is added to the amount of change in the beam current value measured by said measuring part.

5. An accelerator including a beam current measuring device comprising:

a detecting part operable to detect a magnetic field of a beam current;

a magnetic flux transfer part operable to transfer a magnetic flux, corresponding to the magnetic field detected by said detecting part, to a measuring part;

said measuring part being operable to measure a change in the beam current value according to a change in the magnetic flux, said measuring part including:

a superconducting quantum interference device (SQUID) operable to receive the magnetic flux transferred from said magnetic flux transfer part, and operable to measure the magnetic flux received from said magnetic flux transfer part according to the amount of magnetic flux passing through said SQUID; and a feedback coil operable to carry a feedback current, wherein
- the value of the feedback current carried by said feedback coil is operable to cancel a change in the magnetic flux passing through said SQUID; and
- the value of the feedback current is operable to represent an amount of change in the beam current value;

a magnetic shielding part including a superconductor operable to magnetically shield each of said detecting part, said magnetic flux transfer part, and said measuring part, from an external space including a space carrying the beam; and a Faraday cup operable to measure the beam current value, wherein an operating point of said SQUID is set according to the measured beam current value measured by said Faraday cup;

wherein, the amount of change in the beam current value is measured by said measuring part after the operating point of said SQUID is set, and the beam current value measured by said Faraday cup is added to the amount of change in the beam current value measured by said measuring part.

* * * * *